United States Patent
Seo et al.

(10) Patent No.: US 9,627,578 B2
(45) Date of Patent: *Apr. 18, 2017

(54) EPITAXIAL WAFER FOR LIGHT-EMITTING DIODES

(75) Inventors: Noriyoshi Seo, Hiki-gun (JP); Atsushi Matsumura, Chichibu (JP); Ryouichi Takeuchi, Kawasaki (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/807,608

(22) PCT Filed: Jul. 4, 2011

(86) PCT No.: PCT/JP2011/065284
§ 371 (c)(1),
(2), (4) Date: Dec. 28, 2012

(87) PCT Pub. No.: WO2012/005215
PCT Pub. Date: Jan. 12, 2012

(65) Prior Publication Data
US 2013/0092901 A1    Apr. 18, 2013

(30) Foreign Application Priority Data
Jul. 6, 2010  (JP) .................................. 2010-154202

(51) Int. Cl.
*H01L 29/06*  (2006.01)
*H01L 33/06*  (2010.01)
(Continued)

(52) U.S. Cl.
CPC .............. *H01L 33/06* (2013.01); *A01G 7/045* (2013.01); *H01L 33/30* (2013.01); *H01L 33/12* (2013.01); *H01L 33/16* (2013.01); *Y02P 60/149* (2015.11)

(58) Field of Classification Search
CPC ......... H01L 33/06; H01L 25/00; H01L 33/30; H01L 33/12; H01L 33/16; A01G 7/045; Y02P 60/149
(Continued)

(56) References Cited

U.S. PATENT DOCUMENTS 5,008,718 A    4/1991  Fletcher et al.
5,694,410 A   12/1997  Motoda et al.
(Continued)

FOREIGN PATENT DOCUMENTS

CN    1871699 A    11/2006
EP    1574126 A1    9/2005
(Continued)

OTHER PUBLICATIONS

International Search Report for PCT/JP2011/065284 dated Aug. 2, 2011.
(Continued)

*Primary Examiner* — Trung Q Dang
*Assistant Examiner* — Patricia Reddington
(74) *Attorney, Agent, or Firm* — Sughrue Mion, PLLC

(57) ABSTRACT

The present invention relates to an epitaxial wafer for a light-emitting diode wherein the peak emission wavelength is 655 nm or more, and it is possible to improve reliability. The epitaxial wafer for light-emitting diodes includes a GaAs substrate (1) and a pn-junction type light-emitting unit (2) provided on the GaAs substrate (1), wherein light-emitting unit (2) is formed as a multilayer structure in which a strained light-emitting layer and a barrier layer are alternately stacked, and the composition formula of the barrier layer is $(Al_X Ga_{1-X})_Y In_{1-Y} P$ ($0.3 \leq X \leq 0.7$, $0.51 \leq Y \leq 0.54$).

15 Claims, 3 Drawing Sheets

(51) Int. Cl.
*A01G 7/04* (2006.01)
*H01L 33/30* (2010.01)
*H01L 33/12* (2010.01)
*H01L 33/16* (2010.01)

(58) Field of Classification Search
USPC .......................................................... 257/13
See application file for complete search history.

(56) References Cited

U.S. PATENT DOCUMENTS

| | | | |
|---|---|---|---|
| 6,107,648 | A | 8/2000 | Shakuda et al. |
| 6,417,522 | B1 | 7/2002 | Wang et al. |
| 6,486,491 | B1 | 11/2002 | Najda |
| 6,815,312 | B2* | 11/2004 | Furukawa et al. ............ 438/455 |
| 8,482,027 | B2* | 7/2013 | Seo et al. ...................... 257/103 |
| 8,754,398 | B2* | 6/2014 | Aihara et al. ................... 257/13 |
| 2002/0038866 | A1* | 4/2002 | Nakatsu et al. ................ 257/13 |
| 2006/0001042 | A1 | 1/2006 | Suzuki et al. |
| 2007/0082467 | A1 | 4/2007 | Hata et al. |
| 2008/0014671 | A1 | 1/2008 | Yamamoto et al. |
| 2009/0135870 | A1 | 5/2009 | Hayat et al. |
| 2009/0140273 | A1 | 6/2009 | Takeuchi et al. |
| 2009/0146163 | A1* | 6/2009 | Cheng .................. H01L 33/145 257/96 |
| 2009/0302307 | A1* | 12/2009 | Gronninger et al. ........... 257/13 |
| 2010/0006818 | A1 | 1/2010 | Matsumura |
| 2011/0316020 | A1* | 12/2011 | Seo et al. ....................... 257/94 |

FOREIGN PATENT DOCUMENTS

| | | |
|---|---|---|
| JP | 64-086569 A | 3/1989 |
| JP | 04-212479 A | 8/1992 |
| JP | 04-273173 A | 9/1992 |
| JP | 05-063291 A | 3/1993 |
| JP | 07-094781 A | 4/1995 |
| JP | 08-316585 A | 11/1996 |
| JP | 9-37648 A | 2/1997 |
| JP | 09-106946 A | 4/1997 |
| JP | 9-246654 A | 9/1997 |
| JP | 11-087764 A | 3/1999 |
| JP | 11-196671 A | 7/1999 |
| JP | 2000-151024 A | 5/2000 |
| JP | 2000-164931 A | 6/2000 |
| JP | 2001-274454 A | 10/2001 |
| JP | 2002-27831 A | 1/2002 |
| JP | 2002-111053 A | 4/2002 |
| JP | 2002-353501 A | 12/2002 |
| JP | 3373561 B2 | 2/2003 |
| JP | 2004-165486 A | 6/2004 |
| JP | 2004-221042 A | 8/2004 |
| JP | 2007-19262 A | 1/2007 |
| JP | 2008-21717 A | 1/2008 |
| JP | 2008-060410 A | 3/2008 |
| JP | 2008-192790 A | 8/2008 |
| JP | 2009-032738 | 2/2009 |
| JP | 2010-212446 A | 9/2010 |
| WO | 2010103737 A1 | 9/2010 |
| WO | WO 2010103737 A1 * | 9/2010 |

OTHER PUBLICATIONS

Office Action mailed on Mar. 18, 2014 from the Japanese Patent Office in Japanese Application No. 2010-154202.
Communication dated Oct. 14, 2014, issued by the Japanese Patent Office in counterpart Application No. 2010-154202.
International Search Report, issued by International Searching Authority in corresponding International Application No. PCT/JP2010/001246, on Mar. 30, 2010.
Notice of Allowance dated Mar. 11, 2013, which issued during the prosecution of U.S. Appl. No. 13/255,166.
Office Action dated Oct. 4, 2012, which issued during the prosecution of U.S. Appl. No. 13/255,166.
Office Action dated Jul. 2, 2013, from the Japanese Patent Office in counterpart application No. 2009-056779.
Communication dated Jul. 16, 2013, from the State Intellectual Property Office of People's Republic of China in counterpart Application No. 201080019083.9.
Communication dated Aug. 8, 2014, from the European Patent Office in counterpart European Application No. 10750496.1.
Office Action dated Oct. 27, 2015, from the Japanese Patent Office in counterpart application No. 2009-056779.
Lee C-Y et al: "The influence of window layers on the performance of 650 nm AlGaInP/GaInP multi-quantum-well light-emitting diodes", Journal of Crystal Growth; vol. 200, No. 3-4, Jun. 14, 1999; pp. 382-390.
Gessmann Th et al: "High-efficiency AlGaInP light-emitting diodes for solid-state lighting applications", Journal of Applied Physics, American Institute of Physics, US, vol. 95, No. 5, (Mar. 5, 2004), pp. 2203-2216.
T.M. Ritter et al. "Energy Level Alignments in Strained-layer GaInP/AlGaInP Laser Diodes: Model Solid Theory Analysis of Pressure-Photoluminescence Experiments" physica status solidi (b), vol. 211 No. 2 (Feb. 4, 1999); pp. 869-883.
Shoou-Jinn Chang et al., "650 nm AlGaInP/GaInP Compressively Strained Multi-Quantum Well Light Emitting Diodes" Japanese Journal of Applied Physics vol. 37 Part 2 No. 6A (Jun. 1, 1998) pp. L653-L655.
T. Y. Wang, et al., "Atmospheric pressure organometallic vapor-phase epitaxial growth and characterization of $Ga_{0.4}In_{0.6}P/(Al_{0.4}Ga_{0.6})_{0.5}In_{0.5}P$ strained quantum wells" Journal of Applied Physics vol. 68 Issue 7 (Oct. 1, 1990) pp. 3356-3363.

* cited by examiner

EPITAXIAL WAFER FOR LIGHT-EMITTING DIODES

TECHNICAL FIELD

The present invention relates to an epitaxial wafer for a light-emitting diode, and relates particularly to an epitaxial wafer for a high-output light-emitting diode.

This application is a National Stage of International Application No. PCT/JP2011/065284, filed on Jul. 4, 2011, which claims priority from Japanese Patent Application No. 2010-154202, filed Jul. 6, 2010, the contents of all of which are incorporated herein by reference in their entirety.

BACKGROUND ART

In recent years, plant growth using artificial light sources has been the subject of much research. In particular, cultivation methods using illumination from light-emitting diodes (LED), which exhibit excellent monochromaticity, provide favorable energy conservation and long life, and can be easily miniaturized, are garnering much attention.

Based on the results of research to date, one emission wavelength band that has been confirmed as a suitable light source for plant growth (photosynthesis) is red light having a wavelength within the region from 600 to 700 nm.

Examples of conventional red light-emitting diodes of this wavelength range that have been investigated include those having light-emitting layers composed of AlGaAs and InGaNP and the like (for example, see Patent Documents 1 to 4).

On the other hand, compound semiconductor LEDs having a light-emitting layer composed of an aluminum-gallium-indium phosphide (composition formula: $(Al_XGa_{1-X})_Y In_{1-Y}P$, wherein $0 \leq X \leq 1$ and $0 < Y \leq 1$) are also known.

Among these LEDs, a light-emitting layer having the composition $Ga_{0.5}In_{0.5}P$ exhibits the longest wavelength, and the peak wavelength obtained from this light-emitting layer is in the near 650 nm. Accordingly, achieving practical application of, and a high level of brightness for, compound semiconductor LEDs in the region to the long wavelength side of 655 nm has proven problematic.

A light-emitting unit having a light-emitting layer composed of $(Al_XGa_{1-X})_Y In_{1-Y}P$ (wherein $0 \leq X \leq 1$ and $0 < Y \leq 1$) is formed on a monocrystalline substrate of gallium arsenide (GaAs).

At this time, the composition of the above-mentioned light-emitting unit is selected so as to match the lattice constant of the GaAs monocrystalline substrate.

On the other hand, although investigations have been conducted into light-emitting layers having strain for laser devices having a different light emission mechanism, there are currently no practical applications of strained light-emitting layers in the field of light-emitting diodes (for example, see Patent Document 5).

Furthermore, investigations are also being pursued into light-emitting diode light-emitting units that utilize a quantum well structure (for example, see Patent Document 6). However, because the quantum effect obtained by utilizing a quantum well structure shortens the emission wavelength, this effect has been unable to be applied to techniques requiring wavelength lengthening.

Patent Document 1: Japanese Unexamined Patent Application, First Publication No. Hei 9-37648
Patent Document 2: Japanese Unexamined Patent Application, First Publication No. 2002-27831
Patent Document 3: Japanese Unexamined Patent Application, First Publication No. 2004-221042
Patent Document 4: Japanese Unexamined Patent Application, First Publication No. 2001-274454
Patent Document 5: Japanese Unexamined Patent Application, First Publication No. 2000-151024
Patent Document 6: Japanese Patent (Granted) Publication No. 3,373,561

DISCLOSURE OF INVENTION

In particular, in the case of LEDs having an emission wavelength within the 660 nm wavelength band suitable for illumination for plant growth, since conventional LEDs having a light-emitting layer composed of AlGaAs exhibit insufficient light output, an LED having higher efficiency has not be realized.

On the other hand, in the case of high-emission efficiency light-emitting layers composed of $(Al_XGa_{1-X})_Y In_{1-Y}P$ (wherein $0 \leq X \leq 1$ and $0 < Y \leq 1$), specific technical issues exist regarding strained light-emitting layers for LEDs that may enable lengthening of the emission wavelength to a wavelength of 650 nm or greater, and therefore it is difficult to achieve practical application of the strained light-emitting layers having high reliability.

In particular, lengthening the emission wavelength to at least 655 nm raises problems in terms of controlling the strain within the light-emitting layer and achieving mass production of LED having high reliability.

The present invention takes the above circumstances into consideration, with an object of providing an epitaxial wafer that enables mass production of LED having high reliability and having an emission wavelength of not less than 655 nm.

In other words, the present invention relates to the aspects described below.

(1) An epitaxial wafer for a light-emitting diode, comprising a GaAs substrate, a pn junction-type light-emitting unit provided on the GaAs substrate,
wherein the light-emitting unit is formed as a multilayer structure in which a strained light-emitting layer and a barrier layer are alternately stacked, and
a composition formula of the barrier layer is $(Al_XGa_{1-X})_Y In_{1-Y}P$ ($0.3 \leq X \leq 0.7$, $0.51 \leq Y \leq 0.54$).

(2) The epitaxial wafer for a light-emitting diode according to (1), wherein a thickness of the barrier layer is within a range from 35 to 50 nm.

(3) The epitaxial wafer for a light-emitting diode according to (1) or (2), wherein the composition formula of the strained light-emitting layer is $(Al_XGa_{1-X})_Y In_{1-Y}P$ ($0 \leq X \leq 0.1$, $0.35 \leq Y \leq 0.46$).

(4) The epitaxial wafer for a light-emitting diode according to any one of (1) to (3), wherein a thickness of the strained light-emitting layer is within a range from 8 to 38 nm.

(5) The epitaxial wafer for a light-emitting diode according to any one of (1) to (4), wherein a strain adjustment layer which is transparent with respect to the emission wavelength, and which has a lattice constant smaller than the lattice constant of the GaAs substrate, is provided on the light-emitting unit.

(6) The epitaxial wafer for a light-emitting diode according to (5), wherein a composition formula of the strain adjustment layer is $(Al_XGa_{1-X})_Y In_{1-Y}P$ ($0 \leq X \leq 1$ and $0.6 \leq Y \leq 1$).

(7) The epitaxial wafer for a light-emitting diode according to (5), wherein a composition formula of the strain adjustment layer is $Al_XGa_{1-X}As_{1-Y}P_Y$ ($0 \leq X \leq 1$, $0.6 \leq Y \leq 1$).

(8) The epitaxial wafer for a light-emitting diode according to (5), wherein a material of the strain adjustment layer is GaP.

(9) The epitaxial wafer for a light-emitting diode according to any one of (5) to (8), wherein a thickness of the strain adjustment layer is within a range from 0.5 to 20 μm.

(10) The epitaxial wafer for a light-emitting diode according to any one of (1) to (9), wherein
the light-emitting unit comprises 8 to 40 layers of the strained light-emitting layer.

(11) The epitaxial wafer for a light-emitting diode according to any one of (1) to (9), comprising a cladding layer on one or both of an upper surface and a lower surface of the light-emitting unit, wherein
a composition formula of the cladding layer is $(Al_XGa_{1-X})_YIn_{1-Y}P$ ($0.5 \leq X \leq 1$, $0.48 \leq Y \leq 0.52$).

(12) The epitaxial wafer for a light-emitting diode according to any one of any one of (1) to (11), wherein a range for a planar orientation of the GaAs substrate is 15°±5° off (100) direction towards (0-1-1) direction.

(13) The epitaxial wafer for a light-emitting diode according to any one of (1) to (12), wherein a diameter of the GaAs substrate is not less than 75 mm.

(14) The epitaxial wafer for a light-emitting diode according to (12), wherein an amount of warping is not more than 200 μm.

(15) The epitaxial wafer for a light-emitting diode according to any one of any one of (2) to (14), which is used for promoting photosynthesis during plant growth, wherein
a peak emission wavelength of the strained light-emitting layer is within a range from 655 to 685 nm.

(16) The epitaxial wafer for a light-emitting diode according to (15), wherein a light emission intensity of the strained light-emitting layer at an emission wavelength of 700 nm is less than 10% of light emission intensity at the peak emission wavelength.

In the epitaxial wafer for a light-emitting diode according to one aspect of the present invention, since a light-emitting unit is formed as a multilayer structure in which a strained light-emitting layer and a barrier layer are alternately stacked, and the composition formula of the barrier layer is $(Al_XGa_{1-X})_YIn_{1-Y}P$ ($0.3 \leq X \leq 0.7$, $0.51 \leq Y \leq 0.54$), it is possible that the inverse strain (tensile strain) with respect to the strained layer, is formed in the barrier layer.

This makes it possible to reduce the composition Y of the strained light-emitting layer to around 0.37, and therefore, it is possible that the peak emission wavelength of the strained light-emitting layer is 655 nm or more.

Further, since the inverse strain (tensile strain) with respect to the strained light-emitting layer is formed in the barrier layer, it is possible to relieve the strain in the strained light-emitting layer by the barrier layer.

Thus, since the occurrence of crystal defects in the interior of the strained light-emitting layer is suppressed, it is possible to improve the reliability of the LED to be produced in an epitaxial wafer for a light-emitting diode.

EMBODIMENTS FOR CARRYING OUT THE INVENTION

Figure 1:
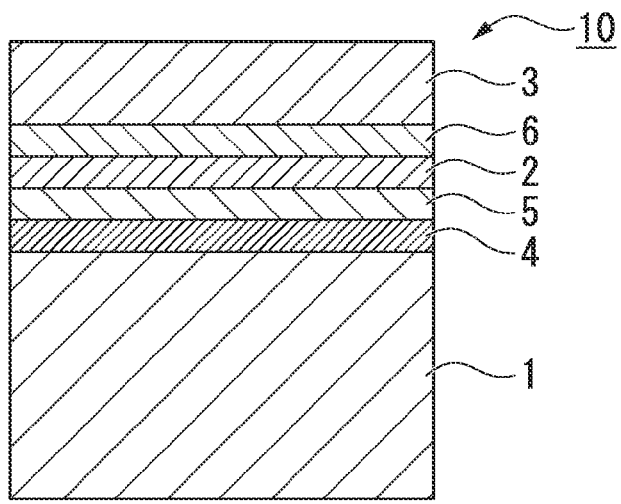
FIG. 1 is a cross-sectional schematic view illustrating an epitaxial wafer for a light-emitting diode according to an embodiment of the present invention.

As follows is a detailed description of an epitaxial wafer for a light-emitting diode, which represents one embodiment of the application of the present invention, and a light-emitting diode chip that uses the epitaxial wafer, with reference to the drawings.

This embodiment has a typical device structure in which electric current flows vertically. The drawings used in the following description have in some cases been drawn with certain features enlarged, in order to assist with comprehension of those features, and as a result, the dimensional ratios between each of the structural components in the drawings may not necessarily represent the actual ratios.

<Epitaxial Wafer for Light-Emitting Diode>

FIG. 1 is a cross-sectional schematic view describing the structure of an epitaxial wafer for a light-emitting diode that represents one embodiment of the application of the present invention.

As illustrated in FIG. 1, a light-emitting diode epitaxial wafer 10 of this embodiment (hereinafter referred to as the epiwafer 10) is composed basically of a GaAs substrate 1, a pn junction-type light-emitting unit 2 provided on the GaAs substrate 1, and a strain adjustment layer 3 provided on the light-emitting unit 2.

More specifically, the epiwafer 10 has a device structure that includes a buffer layer 4 composed of GaAs, a lower cladding layer 5, the light-emitting unit 2, an upper cladding layer 6 and the strain adjustment layer 3 stacked sequentially on top of the GaAs substrate 1.

In the present embodiment, the buffer layer 4, the lower cladding layer 5, the light-emitting unit 2, the upper cladding layer 6 and the strain adjustment layer 3 may sometimes be referred to jointly as the epitaxial growth layers.

This device structure may also include conventional functional layers. For example, conventional layer structures such as a contact layer for reducing the contact resistance of the ohmic electrode, an electric current diffusion layer for achieving planar diffusion of the device drive current across the entire light-emitting unit, or in contrast, a current inhibition layer or current constriction layer for restricting the region through which the device drive current is able to flow, may be provided as required. Furthermore, other conventional layer structures such as a reflective layer (DBR layer) may also be provided on the GaAs substrate 1.

The GaAs substrate 1 may use a commercially available monocrystalline substrate produced using conventional production methods. The surface of the GaAs substrate 1 upon which epitaxial growth is to be performed is preferably smooth. In terms of ensuring ease of epitaxial growth, the planar orientation of the surface of the GaAs substrate 1 is preferably the mass-produced (100) plane and within a range of ±20° off the (100) plane in terms of quality stability. Moreover, the planar orientation of the surface of the GaAs substrate 1 is more preferably 15°±5° off the (100) direction towards the (0-1-1) direction.

In order to improve the crystallinity of the epitaxial growth layers, the dislocation density of the GaAs substrate 1 is preferably low. Specifically, the dislocation density is typically not more than 10,000 cm$^{-2}$, and preferably not more than 1,000 cm$^{-2}$.

The electrical conductivity type of GaAs substrate 1 may be an n-type or p-type substrate. The carrier concentration of the GaAs substrate 1 may be selected as appropriate in order to achieve the desired electrical conductivity and device structure. For example, in the case where the GaAs substrate 1 is a silicon-doped n-type substrate, the carrier concentration is preferably within a range from $1 \times 10^{17}$ to $5 \times 10^{18}$ cm$^{-3}$. In contrast, in the case where the GaAs substrate 1 is a zinc-doped p-type substrate, the carrier concentration is preferably within a range from $2 \times 10^{18}$ to $5 \times 10^{19}$ cm$^{-3}$.

The thickness of the GaAs substrate 1 may be set within an appropriate range in accordance with the substrate size. If the thickness of the GaAs substrate 1 is thinner than this appropriate range, then there is a danger of breakage occurring during the production process for the epiwafer 10, resulting in a reduction in yield.

In contrast, if the thickness of the GaAs substrate 1 is thicker than the appropriate range, then the material costs increase. Accordingly, in those cases where the substrate size of the GaAs substrate 1 is large, for example in the case of a substrate having a diameter of 75 mm, the substrate thickness is preferably within a range from 250 to 500 μm in order to prevent breakage during handling.

Similarly, if the substrate diameter is 50 mm, then the thickness is preferably within a range from 200 to 400 μm. In the case of a substrate diameter of 100 mm, the thickness is preferably within a range from 350 to 600 μm.

In the present embodiment, from the viewpoint of productivity, the diameter of the GaAs substrate 1 is preferably at least 75 mm.

By setting the thickness of the substrate in accordance with the substrate size of the GaAs substrate 1 in this manner, warping of the epiwafer 10 caused by the strained light-emitting layer 7 described below can be reduced. As a result, the temperature distribution during epitaxial growth becomes more uniform, and meaning the wavelength distribution within the plane of the epiwafer 10 can be narrowed. The shape of the GaAs substrate 1 is not limited to circular shapes, and a rectangular shape or the like may also be used.

As illustrated in FIG. 1, the light-emitting unit 2 forms a double hetero structure in combination with the lower cladding layer 5 and the upper cladding layer 6. Further, the light-emitting unit 2 controls the emission wavelength when the epiwafer 10 is used to produce a light-emitting diode (LED), and therefore preferably has a well structure.

Figure 2:
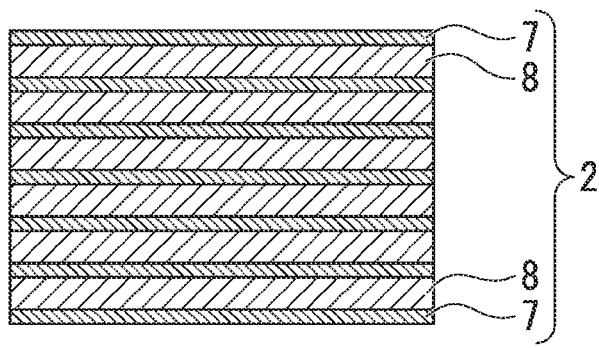
FIG. 2 is a cross-sectional schematic view illustrating the light-emitting unit of an epitaxial wafer for a light-emitting diode according to an embodiment of the present invention.

FIG. 2 is a cross-sectional schematic view illustrating the light-emitting unit of an epitaxial wafer for a light-emitting diode according to an embodiment of the present invention.

As illustrated in FIG. 2, the light-emitting unit 2 is preferably a multilayer structure composed of strained light-emitting layers 7 (well layer) and barrier layers 8 in which a strained light-emitting layer (also referred to as a well layer) 7 is positioned at each of the two outer edges of the structure.

The thickness of the light-emitting unit 2 is preferably within a range from 0.05 to 2 μm. Further, there are no particular limitations on the conduction type of the light-emitting unit 2, and an undoped, p-type or n-type unit may be selected. In order to enhance the light emission efficiency, either an undoped unit or a unit having a carrier concentration of less than $3 \times 10^{17}$ cm$^{-3}$, which offers more favorable crystallinity, is preferred.

The strained light-emitting layers 7 has a composition represented by $(Al_XGa_{1-X})_YIn_{1-Y}P$ ($0 \leq X \leq 0.1$, $0.35 < Y \leq 0.46$).

When the thickness (thickness of a single layer) of a strained light-emitting layer 7 is less than 8 nm, a quantum effect of the well structure causes a shortening of the emission wavelength, making it impossible to achieve the desired emission wavelength of 655 nm or greater.

Accordingly, allowing for fluctuation in the thickness, the thickness of the strained light-emitting layer 7 is preferably at least 8 nm in order to prevent quantum effects. In consideration of ease of control of the thickness, a thickness of at least 10 nm is preferred.

The composition formula of the barrier layer 8 is $(Al_XGa_{1-X})_YIn_{1-Y}P$ ($0.3 \leq X \leq 0.7$, $0.51 \leq Y \leq 0.54$). The value of X is dependent of the element structure of epiwafer 10, and is preferably within a range $0.5 \leq X \leq 0.6$, or a range $0.50 \leq X \leq 0.55$.

Since the light-emitting unit 2 is formed as a multilayer structure in which a strained light-emitting layer 7 and a barrier layer 8 are alternately stacked and a composition formula of the barrier layer is $(Al_XGa_{1-X})_YIn_{1-Y}P$ ($0.3 \leq X \leq 0.7$, $0.51 \leq Y \leq 0.54$), it is possible that the inverse strain (tensile strain) with respect to the strained light-emitting layer 7, is formed in the barrier layer 8.

This makes it possible to reduce Y composition of the strained light-emitting layer 7 to around 0.37, and therefore, it is possible that the peak emission wavelength of the strained light-emitting layer is 655 nm or more.

Further, since the inverse strain (tensile strain) with respect to the strained light-emitting layer 7 is formed in the barrier layer 8, it is possible to relieve the strain in the strained light-emitting layer 7 by the barrier layer 8.

Thus, since the occurrence of crystal defects in the interior of the strained light-emitting layer 7 is suppressed, it is possible to improve the reliability of the LED to be produced in epiwafer 10 (an epitaxial wafer for a light-emitting diode).

The thickness (thickness of a single layer) of a barrier layer 8 is preferably greater than the thickness of the strained light-emitting layer 7. This enables the light emission efficiency of the strained light-emitting layers 7 to be increased.

The thickness of the barrier layer 8 is set in the range of 35 to 50 nm. In other words, the barrier layer 8 is configured to be thicker than the thickness of the general barrier layer.

When the light-emitting unit 2 is formed as a multilayer structure in which a strained light-emitting layer 7 and a barrier layer 8 are alternately stacked and a composition formula of the barrier layer is $(Al_XGa_{1-X})_YIn_{1-Y}P$ ($0.3 \leq X \leq 0.7$, $0.51 \leq Y \leq 0.54$), as well as the thickness of barrier layer 8 is within the range of 35 to 50 nm, since the barrier layer 8 can further reduce the strain of the strained light-emitting layer 7, it is possible to reduce Y composition of the strained light-emitting layer to around 0.35.

Thus, a peak emission wavelength of the strained layer 7 can emit light at a wavelength within the range of 655 to 685 nm, and the occurrence of crystal defects in the interior of the strained light-emitting layer 7 is suppressed, therefore, it is possible to improve the reliability of the LED to be produced in epiwafer 10 (an epitaxial wafer for a light-emitting diode).

On the other hand, if the thickness of the barrier layer 8 exceeds 50 nm, then it approaches the emission wavelength, and optical effects may arise such as light interference or Bragg reflection. Accordingly, the thickness of each barrier layer 8 is preferably not more than 50 nm, and more preferably 40 nm or less. As mentioned have, adopting a structure in which the strained light-emitting layer 7 is relatively thinner and the barrier layer 8 is relatively thicker enables the strain of the strained light-emitting layer 7 to be absorbed by the barrier layer 8, reducing the likelihood of crystal defects in the strained light-emitting layer 7.

In general, when the thickness of the strained light-emitting layer 7 is more than 30 nm, since the amount of strain becomes too large, crystal defects and surface irregularities are likely to occur. However, in the present embodiment, an inverse strain (tensile strain) with respect to the strained light-emitting layer 7 is formed in the barrier layer 8, and a thickness of the barrier layer 8 is thick (in the range of 35 to 50 nm), it is possible to form the light-emitting layer 7 having a thickness of 8 to 38 nm.

In the multilayer structure composed of the strained light-emitting layers 7 and the barrier layers 8, there are no particular limitations on the number of alternately stacked pairs of layers, with each pair composed of a strained light-emitting layer 7 and a barrier layer 8, but at least 8 pairs and not more than 40 pairs is preferable. In other words, the light-emitting unit 2 preferably includes from 8 to 40 strained light-emitting layers 7.

Achieving favorable light emission efficiency for the light-emitting unit 2 requires at least 8 strained light-emitting layers 7. On the other hand, because the strained light-emitting layers 7 and the barrier layers 8 have low carrier concentration levels, if the number of pairs of layers is too large, then the forward voltage (VF) tends to increase. Consequently, the number of pairs of layers is preferably not more than 40, and more preferably 30 or less.

Furthermore, the strain within the strained light-emitting layer 7 is a stress that occurs within the light-emitting unit 2 as a result of the difference in lattice constants between the epitaxial growth substrate and the light-emitting unit 2. Accordingly, if the number of alternately stacked pairs of the strained light-emitting layer 7 and the barrier layer 8 exceeds the above range, namely if the number of strained light-emitting layers 7 contained within the light-emitting unit 2 exceeds the above range, then the light-emitting unit 2 is unable to withstand the strain, resulting in the generation of crystal defects and the occurrence of problems such as a deterioration in the surface state and a reduction in the light emission efficiency.

Figure 3:
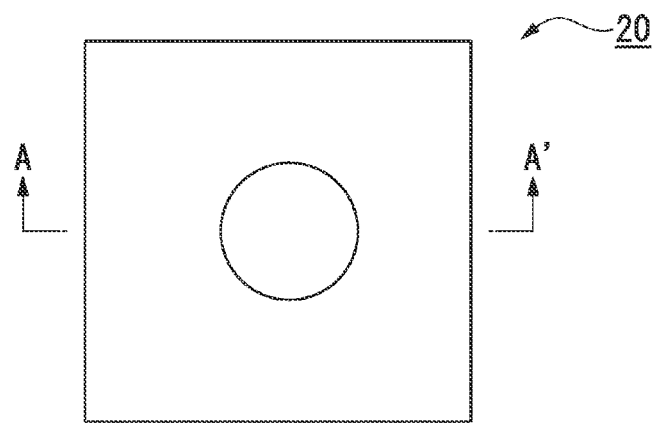
FIG. 3 is a plan view illustrating a light-emitting diode according to an embodiment of the present invention.
Figure 4:
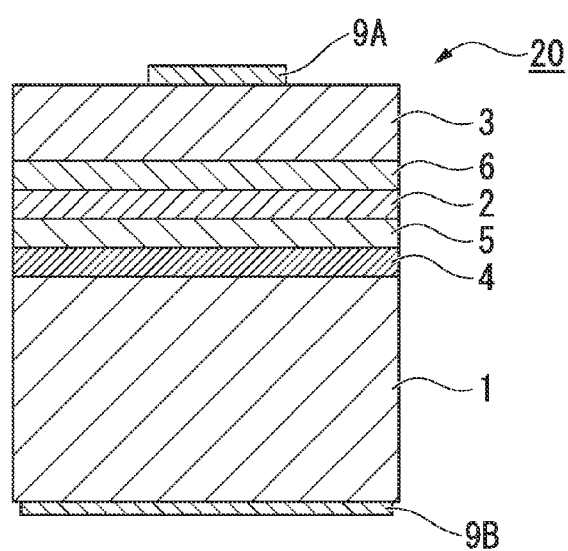
FIG. 4 is a cross-sectional schematic view along the line A-A' in FIG. 3 of a light-emitting diode according to an embodiment of the present invention.

FIG. 3 is a plan view illustrating a light-emitting diode according to an embodiment of the present invention. FIG. 4 is a cross-sectional schematic view along the line A-A' in FIG. 3 of a light-emitting diode according to an embodiment of the present invention.

In those cases where, as illustrated in FIG. 3 and FIG. 4, a device structure is employed in which the current flows vertically through the device (a light-emitting diode 20), the strained light-emitting layers 7 preferably exhibit a peak emission wavelength within a range from 655 to 685 nm, and more preferably within a range from 660 to 670 nm. An emission wavelength within this range is known to be an emission wavelength that is suitable as a light source for plant growth (photosynthesis), and exhibits a high degree of reaction efficacy for photosynthesis.

On the other hand, if light within the long wavelength region of 700 nm or greater is used, then a reaction that inhibits plant growth occurs, and therefore the amount of light within this long wavelength region is preferably minimized. Accordingly, in order to achieve efficient plant growth, red light sources for which the intensity of light within the wavelength region from 655 to 675 nm that is ideal for promoting photosynthesis is strong, but which include no light in the long wavelength region of 700 nm or greater, are the most desirable.

Furthermore, the light emission intensity from the strained light-emitting layer 7 at an emission wavelength of 700 nm is preferably less than 10% of the light emission intensity at the above-mentioned peak emission wavelength. A light-emitting diode produced using an epiwafer 10 containing strained light-emitting layers 7 with these types of characteristics can be used favorably as illumination for promoting photosynthesis during plant growth. Furthermore, in terms of the structure of the strained light-emitting layers 7, the composition, thickness and number of layers may be selected so as to satisfy the above characteristics.

As illustrated in FIG. 1, the strain adjustment layer 3 is provided on top of the light-emitting unit 2 with the upper cladding layer 6 disposed therebetween. Further, the strain adjustment layer 3 is transparent to the emission wavelength from the light-emitting unit 2 (the strained light-emitting layers 7). Moreover, the strain adjustment layer 3 has a lattice constant that is smaller than the lattice constant of the above-mentioned GaAs substrate 1.

As the strain adjustment layer 3, a material having a composition represented by $(Al_XGa_{1-X})_YIn_{1-Y}P$ ($0 \leq X \leq 1$, $0.6 \leq Y \leq 1$) can be used. The value of X varies depending on the device structure of the epiwafer 10, but because materials having a low Al concentration are chemically stable, X is preferably not more than 0.5, and is most preferably 0.

Further, the lower limit for the value of Y is preferably at least 0.6. If a comparison is made between structures in which the strain within the light-emitting unit 2 (the strained light-emitting layers 7) is the same, then a smaller value of Y results in a reduction in the size of the strain adjustment effect provided by the strain adjustment layer 3. This means that the thickness of the strain adjustment layer 3 must be increased, resulting in increased time and cost for deposition of the strain adjustment layer 3, and therefore the value of Y is preferably at least 0.6, and is more preferably 0.8 or greater.

Further, a group III-V semiconductor material that is transparent to the emission wavelength and has a composition represented by $Al_XGa_{1-X}As_{1-Y}P_Y$ ($0 \leq X \leq 1$, $0.6 \leq Y \leq 1$) may also be used favorably as the strain adjustment layer 3.

In the case of a strain adjustment layer 3 having this composition, the lattice constant varies depending on the value of Y. Larger values of Y result in a smaller lattice constant. Further, the degree of transparency relative to the emission wavelength is related to the values of both X and Y, and therefore the values of X and Y are typically selected so as to achieve an appropriately transparent material.

Moreover, GaP may also be used as the strain adjustment layer 3. This GaP requires no adjustment of the composition and also exhibits a large strain adjustment effect, and is therefore the most preferred material for the strain adjustment layer 3 in terms of productivity and stability.

The strain adjustment layer 3 has a smaller lattice constant than that of the GaAs substrate 1 that functions as the epitaxial growth substrate, and therefore has the ability to alleviate fluctuations in the amount of strain incorporated within the strained light-emitting layer 7.

Accordingly, providing the strain adjustment layer 3 has the effects of improving the uniformity of properties such as the emission wavelength, and preventing the occurrence of crystal defects such as cracks. The thickness of the strain adjustment layer 3 is preferably within a range from 0.5 to 20 μm, and is more preferably within a range from 3 to 15 μm.

If the thickness is less than 0.5 μm, then the layer thickness is insufficient to alleviate fluctuations in the amount of strain incorporated within the strained light-emitting layer 7, whereas if the thickness exceeds 20 μm, then the growth time becomes overly long, and the associated costs increase undesirably.

Furthermore, by controlling the composition of the strain adjustment layer 3, warping of the epiwafer 10 can be reduced even in those cases where a thin GaAs substrate 1 is used, and therefore an epiwafer 10 having a narrow in-plane wavelength distribution can be produced.

For substrates of the same thickness, the amount of warping of the epiwafer 10 increases as the size of the GaAs substrate 1 increases. However, by controlling the composition of the strain adjustment layer 3, warping of the epiwafer 10 can be reduced even in those cases where, for example, a large diameter GaAs substrate 1 with a diameter of 75 mm or greater is used.

Moreover, in the case of structures where a functional substrate and the epiwafer 10 are bonded together in order to achieve increased brightness, if the amount of warping of the epiwafer 10 is large, then problems such as cracking may occur, and therefore it is desirable to minimize warping of the epiwafer 10.

The amount of warping of the epiwafer 10, for example in the case where a GaAs substrate 1 having a diameter of 75 mm or greater is used, is preferably not more than 200 μm, and more preferably 150 μm or less.

Warping tends to increase as the substrate size increases. For example, in the case of a substrate size of 75 mm, although the warping varies depending on the composition of the strain adjustment layer and the strained light-emitting layer, and the thickness of the substrate, the amount of warping is typically within a range from approximately 50 to 150 μm. Further, in the case of a substrate size of 100 mm, although the warping varies depending on the composition of the strain adjustment layer and the strained light-emitting layer, and the thickness of the substrate, the amount of warping is typically within a range from approximately 80 to 200 μm.

As illustrated in FIG. 1, the buffer layer 4 is provided on top of the GaAs substrate 1. The buffer layer 4 has a function of reducing the transmission of crystal defects and lattice strain from the substrate used for epitaxial growth.

Accordingly, if the quality of the substrate and the epitaxial growth conditions are selected appropriately, the buffer layer 4 may not be necessary. Further, the material of the buffer layer 4 is preferably the same material as that of the epitaxial growth substrate.

Accordingly, in the present embodiment, the buffer layer 4 preferably employs the same GaAs as the GaAs substrate 1. In order to reduce the transmission of defects, the buffer layer 4 may employ a multilayer film composed of different materials from the GaAs substrate 1. The thickness of the buffer layer 4 is preferably at least 0.1 μm, and is more preferably 0.2 μm or greater.

As illustrated in FIG. 1, the lower cladding layer 5 and the upper cladding layer 6 are provided on the lower surface and upper surface respectively of the light-emitting unit 2.

Specifically, the lower cladding layer 5 is provided on the lower side of the light-emitting unit 2 (on the side of the GaAs substrate 1) and the upper cladding layer 6 is provided on the upper side of the light-emitting unit 2 (on the side of the strain adjustment layer 3). This forms a structure in which the light-emitting unit 2 is sandwiched from above and below by the lower cladding layer 5 and the upper cladding layer 6.

The material for the lower cladding layer 5 and the upper cladding layer 6 is preferably lattice matched to the buffer layer 4 and preferably has a larger band gap than the strained light-emitting layer 7. A material that has a larger band gap than the barrier layer 8 is even more preferred.

Examples of such materials include compounds having a composition represented by $Al_XGa_{1-X}As$ and compounds having a composition represented by $(Al_XGa_{1-X})_YIn_{1-Y}P$ ($0 \leq X \leq 0.1$, $0 \leq Y \leq 1$). In the case of a compound having a composition represented by $Al_XGa_{1-X}As$, the value of X preferably has a lower limit of at least 0.5, and more preferably 0.6 or greater.

Further, in the case of a compound having a composition represented by $(Al_XGa_{1-X})_YIn_{1-Y}P$ ($0 \leq X \leq 0.1$, $0 < Y \leq 1$), the value of X preferably has a lower limit of at least 0.3, and more preferably 0.5 or greater. Further, the value of Y is preferably within a range from 0.48 to 0.52, more preferably within a range from 0.49 to 0.52, and still more preferably within a range from 0.49 to 0.51.

The lower cladding layer 5 and the upper cladding layer 6 have differing polarities. The carrier concentration and thickness of both the lower cladding layer 5 and the upper cladding layer 6 may be set within conventionally preferred ranges, and these conditions are preferably optimized so as to maximize the light emission efficiency from the light-emitting unit 2.

Further, warping of the epiwafer 10 may also be reduced by controlling the composition of the lower cladding layer 5 and the upper cladding layer 6.

Specifically, as the lower cladding layer 5, the use of a semiconductor material composed of a Si-doped n-type $(Al_XGa_{1-X})_YIn_{1-Y}P$ ($0.3 \leq X \leq 1$, $0.48 < Y \leq 0.52$) is preferred. Further, the carrier concentration is preferably within a range from $1 \times 10^{17}$ to $1 \times 10^{18}$ cm$^{-3}$, and the thickness is preferably within a range from 0.5 to 2 μm.

The polarity of the lower cladding layer 5 is the same as the polarity of the GaAs substrate 1 (n-type), but this need not necessarily be the case in those cases where the epiwafer 10 is used within an LED having a structure in which the GaAs substrate 1 has been removed.

As the upper cladding layer 6, the use of a semiconductor material composed of a Mg-doped p-type $(Al_XGa_{1-X})_YIn_{1-Y}P$ ($0.3 \leq X \leq 1$, $0.48 < Y \leq 0.52$) is preferred.

Further, the carrier concentration is preferably within a range from $2 \times 10^{17}$ to $2 \times 10^{18}$ cm$^{-3}$, and the thickness is preferably within a range from 0.5 to 5 μm. The polarity of the upper cladding layer 6 (and the strain adjustment layer 3) may be selected with due consideration of the device structure.

For example, as illustrated in FIG. 3 and FIG. 4, in those cases where the epiwafer 10 is applied to a light-emitting diode 20 having a structure in which the electric current flows vertically, the polarity of the upper cladding layer 6 is set to a polarity (p-type) that is different from that of the GaAs substrate 1.

Further, intermediate layers may be provided between the lower cladding layer 5 and the light-emitting unit 2, between the light-emitting unit 2 and the upper cladding layer 6, and between the upper cladding layer 6 and the strain adjustment layer 3, in order to ensure gradual change of the band discontinuity between the layers. In such cases, each of the intermediate layers is preferably formed from a semiconductor material having a forbidden bandwidth that is midway between that of the two layers.

In addition, in the composition formula of the layers of the epitaxial wafer, the value of X or Y is independent of each layer, and may be the same with or different from the other layer.

<Method of Producing Epitaxial Wafer>

Next is a description of a method of producing the epitaxial wafer 10 for a light-emitting diode (the epiwafer 10) according to the present embodiment.

The epiwafer 10 of the present embodiment is produced by sequentially growing epitaxial growth layers composed of the buffer layer 4, the lower cladding layer 5, the light-emitting unit 2, the upper cladding layer 6 and the strain adjustment layer 3 on top of the GaAs substrate 1.

In the present embodiment, conventional growth methods such as molecular beam epitaxy (MBE) and reduced-pressure metalorganic chemical vapor deposition (MOCVD) may be employed. Of these, the use of the MOCVD method, which offers superior applicability to mass production, is particularly desirable. Specifically, the GaAs substrate 1 used in the growing process is preferably subjected to preliminary treatments such as washing and heating treatments prior to the growing process in order to remove contaminants and any natural oxide film from the substrate surface.

The layers that constitute the above-mentioned epitaxial growth layers can be produced by simultaneous epitaxial growth on 8 or more GaAs substrates 1 of diameter 50 to 150 mm positioned inside the MOCVD apparatus. Commercially available large-scale apparatus such as self-rotating or high-speed rotating apparatus may be used as the MOCVD apparatus.

During epitaxial growth of each of the above epitaxial growth layers, phosphine ($PH_3$) and Arsine ($AsH_3$) and the like may be used as raw materials for the group V elements. In terms of the growing temperature used for each of the layers, in those cases where a p-type GaP is used as the strain adjustment layer 3, growth of the strain adjustment layer 3 is typically performed at a temperature within a range from 720 to 770° C., whereas the other layers are typically grown at 600 to 700° C. Moreover, the carrier concentration, thickness and temperature conditions for each layer may be selected as appropriate.

Further, bis(cyclopentadienyl)magnesium (bis-$(C_5H_5)_2$ Mg) or the like can be used as a Mg doping material. Furthermore, disilane ($Si_2H_6$) or the like can be used as a Si doping material.

The epiwafer 10 produced in this manner has a favorable surface state with minimal crystal defects, despite having a strained light-emitting layer 7. Further, the epiwafer 10 may be subjected to surface processing such as polishing of the device structure. Furthermore, the back surface of the GaAs substrate 1 may be subjected to grinding to regulate the thickness of the structure.

<Light-Emitting Diode for Plant Growth>

As follows is a description of a case in which the epitaxial wafer 10 for a light-emitting diode (the epiwafer 10) according to the present invention is used as a device.

As illustrated in FIG. 3 and FIG. 4, the light-emitting diode 20 has a device structure employing the epiwafer 10 in which electric current flows vertically.

Specially, in the light-emitting diode 20, ohmic electrodes 9A and 9B that have been processed to the desired shape are provided on the upper surface of the strain adjustment layer 3 and the lower surface of the GaAs substrate 1 respectively. Conventional electrode materials may be used for these ohmic electrodes 9A and 9B. For example, AuGe or the like may be used for an n-type electrode, and AuBe or the like may be used for a p-type electrode.

The light-emitting diode 20 can be produced by forming the ohmic electrodes 9A and 9B on the upper and lower surfaces respectively of the epiwafer 10, using a dicing method to cut the wafer into chips of the desired size, and then removing the fractured layers by etching.

Figure 5:
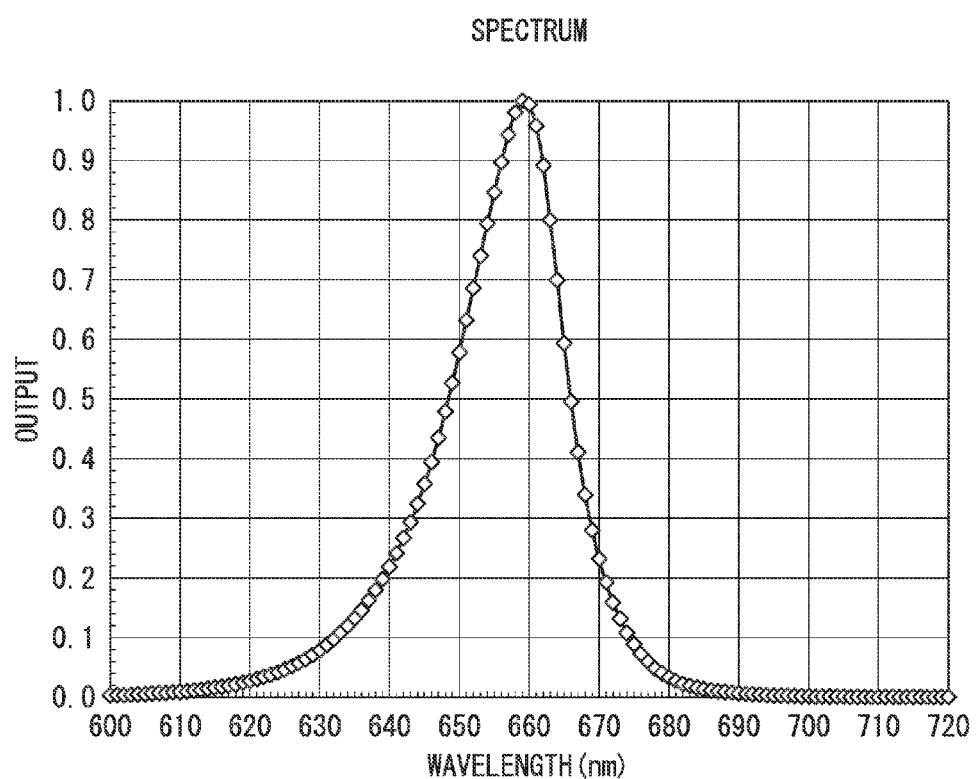
FIG. 5 is a diagram illustrating the emission spectrum of a light-emitting diode according to an embodiment of the present invention.

FIG. 5 is a diagram illustrating the emission spectrum of a light-emitting diode according to an embodiment of the present invention.

As illustrated in FIG. 5, the emission spectrum of the light-emitting diode 20 has a peak emission wavelength within a range from 655 to 675 nm. Further, the emission intensity at an emission wavelength of 700 nm is less than 10% of the emission intensity at the peak emission wavelength. Accordingly, the light-emitting diode 20 produced using the epiwafer 10 can be used favorably as the illumination for promoting photosynthesis during plant growth.

As described above, in the epiwafer 10 according to the present embodiment, since the light-emitting unit 2 is formed as a multilayer structure in which a strained light-emitting layer 7 and a barrier layer 8 are alternately stacked and a composition formula of the barrier layer is $(Al_XGa_{1-X})_YIn_{1-Y}P$ ($0.3 \le X \le 0.7$, $0.51 \le Y \le 0.54$), it is possible that the inverse strain (tensile strain) with respect to the strained light-emitting layer 7, is formed in the barrier layer 8.

This makes it possible to reduce Y composition of the strained light-emitting layer 7 to around 0.37, and therefore, it is possible that the peak emission wavelength of the strained light-emitting layer is 655 nm or more.

Further, since the inverse strain (tensile strain) with respect to the strained light-emitting layer 7 is formed in the barrier layer 8, it is possible to relieve the strain in the strained light-emitting layer 7 by the barrier layer 8.

Thus, since the occurrence of crystal defects in the interior of the strained light-emitting layer 7 is suppressed, it is possible to improve the reliability of the LED to be produced in epiwafer 10 (an epitaxial wafer for a light-emitting diode).

When the light-emitting unit 2 is formed as a multilayer structure in which a strained light-emitting layer 7 and a barrier layer 8 are alternately stacked and a composition formula of the barrier layer is $(Al_XGa_{1-X})_YIn_{1-Y}P$ ($0.3 \le X \le 0.7$, $0.51 \le Y \le 0.54$), as well as the thickness of barrier layer 8 is within the range of 35 to 50 nm, since the barrier layer 8 can further reduce the strain of the strained light-emitting layer 7, it is possible to reduce Y composition of the strained light-emitting layer to around 0.35.

Thus, a peak emission wavelength of the strained layer 7 can emit light at a wavelength within the range of 655 to 685 nm, and the occurrence of crystal defects in the interior of the strained light-emitting layer 7 is suppressed, therefore, it is possible to improve the reliability of the LED to be produced in epiwafer 10 (an epitaxial wafer for a light-emitting diode).

Furthermore, in the epiwafer 10 of the present embodiment, the strain adjustment layer 3 is provided on top of the light-emitting unit 2. This strain adjustment layer 3 is transparent to the emission wavelength, and therefore when the light-emitting diode 20 is produced using this epiwafer 10, light emission from the light-emitting unit 2 is not absorbed by the strain adjustment layer 3. Moreover, because this strain adjustment layer 3 has a smaller lattice constant than that of the GaAs substrate 1, the amount of warping of the overall epiwafer 10 can be reduced. Accordingly, the occurrence of defects within the strained light-emitting layer 7 can be suppressed.

EXAMPLES

The effects of the present invention are described in further detail below using a series of examples, although the present invention is in no way limited by these examples.

In the examples, specific descriptions are provided of examples of producing light-emitting diodes using an epitaxial wafer for a light-emitting diode according to the present invention. The light-emitting diodes produced in the examples are red light-emitting diodes having an AlGaInP light-emitting unit. In the examples, an epiwafer was prepared by growing epitaxial growth layers including a strain adjustment layer composed of GaP on top of a GaAs substrate. In order to evaluate the properties of the wafer, light-emitting diode chips were prepared, and evaluations were made of the property fluctuations within the wafer plane and between wafers.

Example 1

In a light-emitting diode of Example 1, first, an epitaxial wafer was prepared by sequentially stacking epitaxial growth layers on top of a semiconductor substrate composed of monocrystalline Si-doped n-type GaAs. In the n-type GaAs substrate, the growth plane was inclined 15° from the (100) plane towards the (0-1-1) direction, and the carrier concentration was $2 \times 10^{18}$ cm$^{-3}$.

The epitaxial growth layers were prepared on n-type GaAs substrate by sequentially stacking a buffer layer composed of Si-doped n-type GaAs, a low-resistance layer composed of Si-doped n-type $(Al_{0.5}Ga_{0.5})_{0.5}In_{0.5}P$, a lower cladding layer composed of Si-doped n-type $Al_{0.5}In_{0.5}P$, a light-emitting unit which was formed by stacking a strained light-emitting layer composed of undoped $Ga_{0.42}In_{0.58}P$ and a barrier layer composed of undoped $(Al_{0.53}Ga_{0.47})_{0.51}In_{0.49}P$ alternately, an upper cladding layer composed of Mg-doped p-type $Al_{0.5}In_{0.5}P$, a thin-film intermediate layer composed of $(Al_{0.6}Ga_{0.4})_{0.5}In_{0.5}P$, and a strain adjustment layer composed of Mg-doped p-type GaP.

In addition, the thickness of the single layer of the strained light-emitting layer was 10 nm, and the strained light-emitting layer had 21 layers. The thickness of the single layer of the barrier layer was 45 nm, and the barrier layer had 20 layers.

In Example 1, a reduced-pressure metalorganic chemical vapor deposition apparatus (MOCVD apparatus) was used, and epitaxial wafers were formed by simultaneous growth on 18 GaAs substrates each having a diameter of 76 mm and a thickness of 350 μm.

Further, bis(cyclopentadienyl)magnesium (bis-$(C_5H_5)_2$ Mg) was used as the Mg doping material. Furthermore, disilane ($Si_2H_6$) was used as the Si doping material. Moreover, phosphine ($PH_3$) and Arsine ($AsH_3$) were used as the raw materials for the group V elements. In terms of the growing temperature used for each of the layers, growth of the strain adjustment layer composed of p-type GaP was performed at 770° C., whereas each of the other layers was grown at 680° C.

The buffer layer composed of GaAs had a carrier concentration of approximately $2 \times 10^{18}$ cm$^{-3}$ and a thickness of approximately 0.5 μm. The low-resistance layer had a carrier concentration of approximately $3 \times 10^{18}$ cm$^{-3}$ and a thickness of approximately 3 μm. The lower cladding layer had a carrier concentration of approximately $2 \times 10^{18}$ cm$^{-3}$ and a thickness of approximately 0.5 μm. The strained light-emitting layer was composed of a layer of undoped $Ga_{0.42}In_{0.58}P$ with a thickness of approximately 10 nm, and the barrier layer was composed of a layer of undoped $(Al_{0.53}Ga_{0.47})_{0.51}In_{0.49}P$ with a thickness of approximately 45 nm. 22 pairs of the strained light-emitting layer and barrier layer were stacked in an alternating manner. The upper cladding layer had a carrier concentration of approximately $8 \times 10^{17}$ cm$^{-3}$ and a thickness of approximately 0.5 μm. The intermediate layer had a carrier concentration of approximately $8 \times 10^{17}$ cm$^{-3}$ and a thickness of approximately 0.05 μm. The strain adjustment layer composed of GaP had a carrier concentration of approximately $3 \times 10^{18}$ cm$^{-3}$ and a thickness of approximately 9 μM.

Next, in order to reduce the thickness of the epiwafer to 250 μm, the GaAs substrate was subjected to grinding to alter the thickness.

Subsequently, a vacuum deposition method was used to deposit 0.2 μm of AuBe and 1 μm of Au on the surface of the strain adjustment layer composed of GaP that constitutes part of the epitaxial growth layers. A typical photolithography technique was then used to form a mask and perform patterning of AuBe and Au film by through the resulting mask, thus forming a circular p-type ohmic electrode having a diameter of 100 μm. And then the mask was removed.

Next, a vacuum deposition method was used to deposit 0.5 μm of AuGe/Ni alloy and 1 μm of Au on the back surface of the GaAs substrate 1, thus perform patterning of AuGe/Ni alloy film and Au film, then forming an n-type ohmic electrode.

Subsequently, alloying was performed by conducting a heat treatment at 450° C. for 10 minutes, thus completing formation of low-resistance p-type and n-type ohmic electrodes.

Next, a dicing saw was used to cut the GaAs substrate at intervals of 350 μm, thus forming a series of chips. Fractured layers and soiling caused by the dicing were removed by etching with a mixed solution of sulfur acid and hydrogen peroxide, completing preparation of light-emitting diodes of Example 1.

The light-emitting diode chips of Example 1 prepared in the manner described above were sampled uniformly, and 17 light-emitting diode lamps each mounted on a mounting substrate were assembled from each of the 18 wafers, giving a total of 17×18=306 lamps.

For light-emitting diode of Example 1, the presence or absence of surface defects, the value of peak emission wavelength, variability of the peak emission wavelength in the substrate surface, and the ratio of output before and after the power-on test were evaluated. These results are shown in Table 1. In addition, Table 1 also shows the evaluation results of Examples 2-16 and Comparative Examples 1 to 6, which will be described later.

The presence or absence of surface defects was evaluated prior to cutting the substrate GaAs. In addition, surface defects were examined by optical microscope and visually by condensing light. The values of luminance were measured before and after the power-on test in which an electric current was passed through the light-emitting diode for 20 hours at the current of 100 mA, respectively, then, the value of the luminance after the power-on test is divided by that of the luminance before the power-on test, and the result was multiplied by 100 (which is a ratio of output before and after the power-on test (%)).

The variability of the peak emission wavelength in the substrate surface may be any within 3 nm, the ratio of output before and after the current test may be 90% or greater. Also the variability of the peak emission wavelength in the substrate surface may be 3 nm or less, the output may be 3 mW or greater.

As shown in Table 1, in the case of the light-emitting diodes of Example 1, the good results that a peak emission wavelength was 660.8 nm, there was no surface defects, variability of the peak emission wavelength in the substrate surface (min-max) was as small as 2.4 nm, the output power was 3.9 mW, and the output ratio of before and after the power-on test was 100%, were obtained.

Example 2

In the light-emitting diode of Example 2, the light-emitting diode was formed as the same as that of Example 1, except that only the strained light-emitting layer of the above Example 1 was altered to a layer of undoped $Ga_{0.36}In_{0.64}P$.

As shown in Table 1, in the case of the light-emitting diodes of Example 2, the good results that a peak emission wavelength was 681.5 nm, there was no surface defects, variability of the peak emission wavelength in the substrate surface (min-max) was as small as 2.6 nm, the output power was 3.5 mW, and the output ratio of before and after the power-on test was 98%, were obtained.

Example 3

In the light-emitting diode of Example 3, the light-emitting diode was formed as the same as that of Example 1, except that the strained light-emitting layer of the above Example 1 was altered to a layer of undoped $Ga_{0.35}In_{0.65}P$, and the barrier layer of the Example 1 was altered to a layer of undoped $(Al_{0.53}Ga_{0.47})_{0.54}In_{0.46}P$.

As shown in Table 1, in the case of the light-emitting diodes of Example 3, the good results that a peak emission wavelength was 685.3 nm, there was no surface defects, variability of the peak emission wavelength in the substrate surface (min-max) was as small as 2.5 nm, the output power was 3.1 mW, and the output ratio of before and after the power-on test was 98%, were obtained.

Example 4

In the light-emitting diode of Example 4, the light-emitting diode was formed as the same as that of Example 1, except that the barrier layer of the Example 1 was altered to a layer of undoped $Ga_{0.51}In_{0.49}P$, with thickness of 30 nm.

As shown in Table 1, in the case of the light-emitting diodes of Example 4, the good results that a peak emission wavelength was 660.7 nm, there was no surface defects, variability of the peak emission wavelength in the substrate surface was as small as 2.2 nm, the output power was 3.6 mW, and the output ratio of before and after the power-on test was 92%, were obtained.

Example 5

In the light-emitting diode of Example 5, the light-emitting diode was formed as the same as that of Example 4, except that only the strained light-emitting layer of the above Example 4 was altered to a layer of undoped $Ga_{0.39}In_{0.61}P$.

As shown in Table 1, in the case of the light-emitting diodes of Example 5, the good results that a peak emission wavelength was 670.1 nm, there was no surface defects, variability of the peak emission wavelength in the substrate surface was as small as 2.7 nm, the output power was 3.8 mW, and the output ratio of before and after the power-on test was 91%, were obtained.

Example 6

In the light-emitting diode of Example 6, the light-emitting diode was formed as the same as that of Example 4, except that the strained light-emitting layer of the above Example 4 was altered to a layer of undoped $Ga_{0.37}In_{0.63}P$, and the barrier layer of the Example 4 was altered to a layer of undoped $(Al_{0.53}Ga_{0.47})_{0.54}In_{0.46}P$.

As shown in Table 1, in the case of the light-emitting diodes of Example 6, the good results that a peak emission wavelength was 678.0 nm, there was no surface defects, variability of the peak emission wavelength in the substrate surface was as small as 2.7 nm, the output power was 3.3 mW, and the output ratio of before and after the power-on test was 98%, were obtained.

Example 7

In the light-emitting diode of Example 7, the light-emitting diode was formed as the same as that of Example 1, except that the strained light-emitting layer of the above Example 1 was altered to a layer composed of 23 layers of undoped $Ga_{0.44}In_{0.56}P$ having a thickness of 17 nm, and the barrier layer of the Example 1 was altered to a 22-layers barrier layer having a thickness of 38 nm.

As shown in Table 1, in the case of the light-emitting diodes of Example 7, the good results that a peak emission wavelength was 661.0 nm, there was no surface defects, variability of the peak emission wavelength in the substrate surface was as small as 2 nm, the output power was 4 mW, and the output ratio of before and after the power-on test was 98%, were obtained.

Example 8

In the light-emitting diode of Example 8, the light-emitting diode was formed as the same as that of Example 7, except that only the strained light-emitting layer of the above Example 7 was altered to a layer of undoped $Ga_{0.4}In_{0.6}P$.

As shown in Table 1, in the case of the light-emitting diodes of Example 8, the good results that a peak emission wavelength was 673.5 nm, there was no surface defects, variability of the peak emission wavelength in the substrate surface was as small as 2.1 nm, the output power was 3.8 mW, and the output ratio of before and after the power-on test was 97%, were obtained.

Example 9

In the light-emitting diode of Example 9, the light-emitting diode was formed as the same as that of Example 8, except that the light-emitting diode was formed as the same as that of Example 8, except that the strained light-emitting layer of the above Example 8 was altered to a layer of undoped $Ga_{0.38}In_{0.62}P$, and the barrier layer of the Example 8 was altered to a layer having a thickness of 50 nm (the thickness of single layer).

As shown in Table 1, in the case of the light-emitting diodes of Example 9, the good results that a peak emission wavelength was 680.3 nm, there was no surface defects, variability of the peak emission wavelength in the substrate surface (min-max) was as small as 2.3 nm, the output power was 3.4 mW, and the output ratio of before and after the power-on test was 97%, were obtained.

Example 10

In the light-emitting diode of Example 10, the light-emitting diode was formed as the same as that of Example 7, except that the barrier layer of the Example 7 was altered to a layer having a thickness of 35 nm (the thickness of single layer).

As shown in Table 1, in the case of the light-emitting diodes of Example 10, the good results that a peak emission wavelength was 661.2 nm, there was no surface defects, variability of the peak emission wavelength in the substrate surface (min-max) was as small as 2 nm, the output power was 3.9 mW, and the output ratio of before and after the power-on test was 98%, were obtained.

Example 11

In the light-emitting diode of Example 11, the light-emitting diode was formed as the same as that of Example 10, except that the barrier layer of the Example 10 was altered to a layer having a thickness of 19 nm (the thickness of single layer).

As shown in Table 1, in the case of the light-emitting diodes of Example 11, the good results that a peak emission wavelength was 660.7 nm, there was no surface defects, variability of the peak emission wavelength in the substrate surface (min-max) was as small as 2.1 nm, the output power was 3.9 mW, and the output ratio of before and after the power-on test was 90%, were obtained.

Example 12

In the light-emitting diode of Example 12, the light-emitting diode was formed as the same as that of Example 11, except that only the strained light-emitting layer of the above Example 11 was altered to a layer of undoped $Ga_{0.42}In_{0.58}P$.

As shown in Table 1, in the case of the light-emitting diodes of Example 12, the good results that a peak emission wavelength was 666.3 nm, there was no surface defects, variability of the peak emission wavelength in the substrate surface (min-max) was as small as 2.1 nm, the output power was 3.8 mW, and the output ratio of before and after the power-on test was 90%, were obtained.

Example 13

In the light-emitting diode of Example 13, the light-emitting diode was formed as the same as that of Example 4, except that only the strained light-emitting layer of the above Example 1 was altered to a layer of undoped $Ga_{0.45}In_{0.55}P$, which has a thickness of 25 nm.

As shown in Table 1, in the case of the light-emitting diodes of Example 13, the good results that a peak emission wavelength was 655.8 nm, there was no surface defects, variability of the peak emission wavelength in the substrate surface (min-max) was as small as 2.2 nm, the output power was 3.9 mW, and the output ratio of before and after the power-on test was 98%, were obtained.

Example 14

In the light-emitting diode of Example 14, the light-emitting diode was formed as the same as that of Example 13, except that the strained light-emitting layer of the above Example 13 was altered to a layer having a thickness of 30 nm, and the barrier layer of the Example 13 was altered to a layer having a thickness of 50 nm.

As shown in Table 1, in the case of the light-emitting diodes of Example 14, the good results that a peak emission wavelength was 665.0 nm, there was no surface defects, variability of the peak emission wavelength in the substrate surface was as small as 2.2 nm, the output power was 3.9 mW, and the output ratio of before and after the power-on test was 97%, were obtained.

Example 15

In the light-emitting diode of Example 15, the light-emitting diode was formed as the same as that of Example 14, except that the barrier layer of the Example 14 was altered to a layer having a thickness of 38 nm.

As shown in Table 1, in the case of the light-emitting diodes of Example 15, the good results that a peak emission wavelength was 671.5 nm, there was no surface defects, variability of the peak emission wavelength in the substrate surface (min-max) was as small as 2 nm, the output power was 3.8 mW, and the output ratio of before and after the power-on test was 97%, were obtained.

Example 16

In the light-emitting diode of Example 16, the light-emitting diode was formed as the same as that of Example 9, except that only the strained light-emitting layer of the above Example 9 was altered to a layer of undoped $(Al_{0.1}Ga_{0.9})_{0.38}In_{0.62}P$.

As shown in Table 1, in the case of the light-emitting diodes of Example 16, the good results that a peak emission wavelength was 660.5 nm, there was no surface defects, variability of the peak emission wavelength in the substrate surface was as small as 2.4 nm, the output power was 3.6 mW, and the output ratio of before and after the power-on test was 97%, were obtained.

Comparative Example 1

In the light-emitting diode of Comparative Example 1, the light-emitting diode was formed as the same as that of Example 9, except that the barrier layer of the Example 9 was altered to a layer having a thickness of 55 nm.

As shown in Table 1, in the case of the light-emitting diodes of Comparative Example 1, the results that a peak emission wavelength was 679.8 nm, there was no surface defect, variability of the peak emission wavelength in the substrate surface was as small as 2.4 nm, and the output ratio of before and after the power-on test was 95%, were obtained.

However, the output was 2.2 mW which was less than 3.0 mW. This was probably because that the thickness of the barrier layer was beyond the range of 35 to 50 nm (in other words, since the thickness of the barrier layer was too thick).

Comparative Example 2

In the light-emitting diode of Comparative Example 2, the light-emitting diode was formed as the same as that of Example 3, except that the barrier layer of the Example 3 was altered to a layer of undoped $(Al_{0.53}Ga_{0.47})_{0.5}In_{0.5}P$ (the composition containing almost no strain in the barrier layer).

As shown in Table 1, in the case of the light-emitting diodes of Comparative Example 2, the results that a peak emission wavelength was 685.0 nm, there was surface defects, variability of the peak emission wavelength in the substrate surface (min-max) was as large as 3.6 nm, the output power was as low as 1.5 mW, and the output ratio of before and after the power-on test was as low as 78%, were obtained.

In other words, poor results were obtained regarding the surface defect inspection, variation of peak emission wavelength in the substrate surface, the output, and the ratio of output before and after the power-on test. This was probably because that the composition formula $(Al_XGa_{1-X})_YIn_{1-Y}P$ of the barrier layer was beyond the range of $0.51 \leq Y \leq 0.54$ (specifically, since the barrier layer did not contain the strain).

Comparative Example 3

In the light-emitting diode of Comparative Example 3, the light-emitting diode was formed as the same as that of Comparative Example 2, except that the strained light-emitting layer of Comparative Example 2 was altered to a layer of undoped $Ga_{0.34}In_{0.66}P$, and the barrier layer of the Comparative Example 2 was altered to a layer of undoped $(Al_{0.53}Ga_{0.47})_{0.55}In_{0.45}P$.

As shown in Table 1, in the case of the light-emitting diodes of Comparative Example 3, the results that a peak emission wavelength was 688.5 nm, there was surface defects, variability of the peak emission wavelength in the substrate surface was as large as 3.8 nm, the output power was as low as 1.4 mW, and the output ratio of before and after the power-on test was as low as 81%, were obtained.

In other words, poor results were obtained regarding the surface defect inspection, variation of peak emission wavelength in the substrate surface, the output, and the ratio of output before and after the power-on test. This was probably because that the composition formula $(Al_XGa_{1-X})_YIn_{1-Y}P$ of the barrier layer was beyond the range of $0.51 \leq Y \leq 0.54$.

Comparative Example 4

In the light-emitting diode of Comparative Example 4, the light-emitting diode was formed as the same as that of Example 6, except that the barrier layer of the Comparative Example 2 was altered to a layer of undoped $(Al_{0.53}Ga_{0.47})_{0.5}In_{0.5}P$ (the composition that almost no strain was contained in the barrier layer).

As shown in Table 1, in the case of the light-emitting diodes of Comparative Example 4, the results that a peak emission wavelength was 677.7 nm, there was surface defects, variability of the peak emission wavelength in the substrate surface was as large as 3.9 nm, the output power was as low as 1.3 mW, and the output ratio of before and after the power-on test was as low as 75%, were obtained.

In other words, poor results were obtained regarding the surface defect inspection, variation of peak emission wavelength in the substrate surface, the output, and the ratio of output before and after the power-on test. This was probably because that the composition formula $(Al_XGa_{1-X})_YIn_{1-Y}P$ of the barrier layer was beyond the range of $0.51 \leq Y \leq 0.54$.

Comparative Example 5

In the light-emitting diode of Comparative Example 5, the light-emitting diode was formed as the same as that of Example 16, except that the strained light-emitting layer of Example 16 was altered to a layer of undoped $Ga_{0.41}In_{0.59}P$, and the barrier layer of the Example 16 was altered to a layer of undoped $(Al_{0.53}Ga_{0.47})_{0.5}In_{0.5}P$, with a thickness of 19 nm.

As shown in Table 1, in the case of the light-emitting diodes of Comparative Example 5, the results that a peak emission wavelength was 669.8 nm, there was surface defects, variability of the peak emission wavelength in the substrate surface was as large as 3.3 nm, the output power was as low as 1.3 mW, and the output ratio of before and after the power-on test was as low as 70%, were obtained.

In other words, poor results were obtained regarding the surface defect inspection, variation of peak emission wavelength in the substrate surface, the output, and the ratio of output before and after the power-on test. This was probably because that the composition formula $(Al_XGa_{1-X})_YIn_{1-Y}P$ of the barrier layer was beyond the range of $0.51 \leq Y \leq 0.54$.

Comparative Example 6

In the light-emitting diode of Comparative Example 6, the light-emitting diode was formed as the same as that of Example 15, except that the strained light-emitting layer of Example 15 was altered to a layer having a thickness of 40 nm, and the barrier layer of the Example 15 was altered to a layer of undoped $(Al_{0.53}Ga_{0.47})_{0.5}In_{0.5}P$.

As shown in Table 1, in the case of the light-emitting diodes of Comparative Example 6, the results that a peak emission wavelength was 672.2 nm, there was surface defects, variability of the peak emission wavelength in the substrate surface was as large as 3.1 nm, the output power was as low as 1.1 mW, and the output ratio of before and after the power-on test was as low as 72%, were obtained.

In other words, poor results were obtained regarding the surface defect inspection, variation of peak emission wavelength in the substrate surface, the output, and the ratio of output before and after the power-on test. This was probably because that the composition formula $(Al_XGa_{1-X})_YIn_{1-Y}P$ of the barrier layer was beyond the range of $0.51 \leq Y \leq 0.54$.

From the evaluation results of Examples 1-16 and Comparative Examples 1 to 6, when the light-emitting unit is formed as a multilayer structure in which a strained light-emitting layer and a barrier layer are alternately stacked and a composition formula of the barrier layer is $(Al_{0.53}Ga_{0.47})_YIn_{1-Y}P$ ($0.51 \leq Y \leq 0.54$), the light-emitting diode having a peak emission wavelength within the range of 655.8 to 685.3 nm can be obtained.

In addition, when the light-emitting unit is formed as a multilayer structure in which a strained light-emitting layer and a barrier layer are alternately stacked and a composition formula of the barrier layer is $(Al_{0.53}Ga_{0.47})_YIn_{1-Y}P$ ($0.51 \leq Y \leq 0.54$), as well as the thickness of barrier layer 8 is within the range of 35 to 50 nm, a peak emission wavelength of the strained layer can emit light at a wavelength within the range of 660.5 to 685.3 nm. And the reliability of LED made from the epiwafer (epitaxial wafer for a light-emitting diode) was improved.

TABLE 1

|  | Strain adjustment layer | Value of X in strained light-emitting layer $(Al_XGa_{1-X})_YIn_{1-Y}P$ | Value of Y in strained light-emitting layer $(Al_XGa_{1-X})_YIn_{1-Y}P$ | Strained light-emitting layer thickness (nm) | Number of strained light-emitting layers | Barrier layer thickness (nm) | Number of barrier layers |
|---|---|---|---|---|---|---|---|
| Example 1 | GaP | 0 | 0.42 | 10 | 21 | 45 | 20 |
| Example 2 | GaP | 0 | 0.36 | 10 | 21 | 45 | 20 |

TABLE 1-continued

| | | | | | | | |
|---|---|---|---|---|---|---|---|
| Example 3 | GaP | 0 | 0.35 | 10 | 21 | 45 | 20 |
| Example 4 | GaP | 0 | 0.42 | 10 | 21 | 30 | 20 |
| Example 5 | GaP | 0 | 0.39 | 10 | 21 | 30 | 20 |
| Example 6 | GaP | 0 | 0.37 | 10 | 21 | 30 | 20 |
| Example 7 | GaP | 0 | 0.44 | 17 | 23 | 38 | 22 |
| Example 8 | GaP | 0 | 0.4 | 17 | 23 | 38 | 22 |
| Example 9 | GaP | 0 | 0.38 | 17 | 23 | 50 | 22 |
| Example 10 | GaP | 0 | 0.44 | 17 | 23 | 35 | 22 |
| Example 11 | GaP | 0 | 0.44 | 17 | 23 | 19 | 22 |
| Example 12 | GaP | 0 | 0.42 | 17 | 23 | 19 | 22 |
| Example 13 | GaP | 0 | 0.45 | 25 | 21 | 30 | 20 |
| Example 14 | GaP | 0 | 0.45 | 30 | 21 | 50 | 20 |
| Example 15 | GaP | 0 | 0.45 | 38 | 21 | 50 | 20 |
| Example 16 | GaP | 0.1 | 0.38 | 17 | 23 | 50 | 22 |
| Comparative example 1 | GaP | 0 | 0.38 | 17 | 23 | 55 | 22 |
| Comparative example 2 | GaP | 0 | 0.35 | 10 | 21 | 45 | 20 |
| Comparative example 3 | GaP | 0 | 0.34 | 10 | 21 | 45 | 20 |
| Comparative example 4 | GaP | 0 | 0.37 | 10 | 21 | 30 | 20 |
| Comparative example 5 | GaP | 0 | 0.41 | 17 | 23 | 19 | 22 |
| Comparative example 6 | GaP | 0 | 0.45 | 40 | 21 | 50 | 20 |

| | Value of Y in barrier layer $(Al_XGa_{1-X})_YIn_{1-Y}P$ | Result of surface inspection | VF @ 20 mA (V) | Output @ 20 mA (mW) | Peak emission wavelength (nm) | In-plane variability in peak emission wavelength (nm) | Ratio of output before and after power-on test (%) |
|---|---|---|---|---|---|---|---|
| Example 1 | 0.51 | ○ | 2 | 3.9 | 660.8 | 2.4 | 100 |
| Example 2 | 0.51 | ○ | 2 | 3.5 | 681.5 | 2.6 | 98 |
| Example 3 | 0.54 | ○ | 2 | 3.1 | 685.3 | 2.5 | 98 |
| Example 4 | 0.51 | ○ | 2 | 3.6 | 660.7 | 2.2 | 92 |
| Example 5 | 0.51 | ○ | 2 | 3.8 | 670.1 | 2.7 | 91 |
| Example 6 | 0.54 | ○ | 2.3 | 3.3 | 678.0 | 2.7 | 98 |
| Example 7 | 0.51 | ○ | 2 | 4 | 661.0 | 2 | 98 |
| Example 8 | 0.51 | ○ | 2.1 | 3.8 | 673.5 | 2.1 | 97 |
| Example 9 | 0.51 | ○ | 2.1 | 3.4 | 680.3 | 2.3 | 97 |
| Example 10 | 0.51 | ○ | 2 | 3.9 | 661.2 | 2 | 98 |
| Example 11 | 0.51 | ○ | 2 | 3.9 | 660.7 | 2.1 | 90 |
| Example 12 | 0.51 | ○ | 2 | 3.8 | 666.3 | 2.1 | 90 |
| Example 13 | 0.51 | ○ | 2 | 3.9 | 655.8 | 2.2 | 98 |
| Example 14 | 0.51 | ○ | 2.1 | 3.9 | 665.0 | 2.2 | 97 |
| Example 15 | 0.51 | ○ | 2.2 | 3.8 | 671.5 | 2.0 | 97 |
| Example 16 | 0.51 | ○ | 2.2 | 3.6 | 660.5 | 2.4 | 97 |
| Comparative example 1 | 0.51 | ○ | 2.2 | 2.2 | 679.8 | 2.4 | 95 |
| Comparative example 2 | 0.5 | x | 2 | 1.5 | 685 | 3.6 | 78 |
| Comparative example 3 | 0.55 | x | 2.1 | 1.4 | 688.5 | 3.8 | 81 |
| Comparative example 4 | 0.5 | x | 2.3 | 1.3 | 677.7 | 3.9 | 75 |
| Comparative example 5 | 0.5 | x | 2.3 | 1.3 | 669.8 | 3.3 | 70 |
| Comparative example 6 | 05 | x | 2.4 | 1.1 | 672.2 | 3.1 | 72 |

INDUSTRIAL APPLICABILITY

The light-emitting diode of the present invention provides an epitaxial wafer for a light-emitting diode that exhibits excellent uniformity and productivity, in which the light-emitting layer composed of AlGaInP is capable of high-efficiency light emission at a long emission wavelength of not less than 655 nm. The present invention can be used in all manner of applications where conventional AlGaAs-based LEDs exhibit insufficient output to be applicable, such as plant growth applications, displays, communications, and light sources for sensors.

DESCRIPTION OF THE REFERENCE SIGNS

1: GaAs substrate
2: Light-emitting unit
3: Strain adjustment layer
4: Buffer layer
5: Lower cladding layer
6: Upper cladding layer
7: Strained light-emitting layer
8: Barrier layer
9A, 9B: Ohmic electrode
10: Epitaxial wafer for a light-emitting diode (epiwafer)
20: Light-emitting diode

The invention claimed is:

1. An epitaxial wafer for a light-emitting diode, comprising a GaAs substrate, a pn junction-type light-emitting unit provided on the GaAs substrate,
wherein the light-emitting unit is formed as a multilayer structure in which a strained light-emitting layer and a barrier layer are alternately stacked, and
a composition formula of the barrier layer is $(Al_XGa_{1-X})_YIn_{1-Y}P$ ($0.3 \leq X \leq 0.7$, $0.51 \leq Y \leq 0.54$),
a thickness of the barrier layer is within a range from 35 to 50 nm, and
the light-emitting unit comprises 8 to 40 layers of strained light-emitting layers and is an undoped unit.

2. The epitaxial wafer for a light-emitting diode according to claim 1, wherein the composition formula of the strained light-emitting layer is $(Al_XGa_{1-X})_YIn_{1-Y}P$ ($0 \leq X \leq 0.1$, $0.35 \leq Y \leq 0.46$).

3. The epitaxial wafer for a light-emitting diode according to claim 1, wherein a thickness of the strained light-emitting layer is within a range from 8 to 38 nm.

4. The epitaxial wafer for a light-emitting diode according to claim 1, wherein a strain adjustment layer which is transparent with respect to the emission wavelength, and which has a lattice constant smaller than the lattice constant of the GaAs substrate, is provided on the light-emitting unit.

5. The epitaxial wafer for a light-emitting diode according to claim 4, wherein a composition formula of the strain adjustment layer is $(Al_XGa_{1-X})_YIn_{1-Y}P$ ($0 \leq X \leq 1$ and $0.6 \leq Y \leq 1$).

6. The epitaxial wafer for a light-emitting diode according to claim 4, wherein a composition formula of the strain adjustment layer is $Al_XGa_{1-X}As_{1-Y}P_Y$ ($0 \leq X \leq 1$, $0.6 \leq Y \leq 1$).

7. The epitaxial wafer for a light-emitting diode according to claim 4, wherein a material of the strain adjustment layer is GaP.

8. The epitaxial wafer for a light-emitting diode according to claim 4, wherein a thickness of the strain adjustment layer is within a range from 0.5 to 20 μm.

9. The epitaxial wafer for a light-emitting diode according to claim 1, comprising a cladding layer on one or both of an upper surface and a lower surface of the light-emitting unit, wherein
a composition formula of the cladding layer is $(Al_XGa_{1-X})_YIn_{1-Y}P$ ($0.5 \leq X \leq 1$, $0.48 \leq Y \leq 0.52$).

10. The epitaxial wafer for a light-emitting diode according to claim 1, wherein a range for a planar orientation of the GaAs substrate is $15° \pm 5°$ off (100) direction towards (0-1-1) direction.

11. The epitaxial wafer for a light-emitting diode according to claim 1, wherein a diameter of the GaAs substrate is not less than 75 mm.

12. The epitaxial wafer for a light-emitting diode according to claim 10, wherein an amount of warping is not more than 200 μm.

13. The epitaxial wafer for a light-emitting diode according to claim 1, which is used for promoting photosynthesis during plant growth, wherein
a peak emission wavelength of the strained light-emitting layer is within a range from 655 to 685 nm.

14. The epitaxial wafer for a light-emitting diode according to claim 13, wherein a light emission intensity of the strained light-emitting layer at an emission wavelength of 700 nm is less than 10% of light emission intensity at the peak emission wavelength.

15. An epitaxial wafer for a light-emitting diode, comprising a GaAs substrate, a pn junction-type light-emitting unit provided on the GaAs substrate,
wherein the light-emitting unit is formed as a multilayer structure in which a strained light-emitting layer and a barrier layer are alternately stacked,
a composition formula of the barrier layer is $(Al_XGa_{1-X})_YIn_{1-Y}P$ ($0.3 \leq X \leq 0.7$, $0.51 \leq Y \leq 0.54$),
a strain adjustment layer which is transparent with respect to the emission wavelength, which has a lattice constant smaller than the lattice constant of the GaAs substrate, and which has a thickness within a range from 3 to 15 μm is provided on the light-emitting unit,
the light-emitting unit comprises 8 to 40 layers of strained light-emitting layers and is an undoped unit, and
a thickness of the barrier layer is within a range from 35 to 50 nm.

* * * * *